US009109922B2

(12) United States Patent
Gierczak et al.

(10) Patent No.: US 9,109,922 B2
(45) Date of Patent: Aug. 18, 2015

(54) MAGNETICALLY-IMPERVIOUS RETROFIT KIT FOR A METERED-COMMODITY CONSUMPTION METER

(71) Applicant: Honeywell International Inc., Morristown, NJ (US)

(72) Inventors: Marek Gierczak, Meylan (FR); Remy Chaumont, Meylan (FR); Pascal Schweizer, Meylan (FR); Christophe Le Moing, Montbonnot (FR)

(73) Assignee: Honeywell International Inc., Morristown, NJ (US)

( * ) Notice: Subject to any disclaimer, the term of this patent is extended or adjusted under 35 U.S.C. 154(b) by 237 days.

(21) Appl. No.: 13/939,777

(22) Filed: Jul. 11, 2013

(65) Prior Publication Data
US 2015/0015414 A1   Jan. 15, 2015

(51) Int. Cl.
| | |
|---|---|
| *G01D 4/00* | (2006.01) |
| *G01R 21/133* | (2006.01) |
| *G01R 1/00* | (2006.01) |
| *G01R 11/16* | (2006.01) |
| *G01R 11/02* | (2006.01) |
| *G01R 11/24* | (2006.01) |

(Continued)

(52) U.S. Cl.
CPC ............. *G01D 4/002* (2013.01); *G01D 4/008* (2013.01); *G01R 1/00* (2013.01); *G01R 11/02* (2013.01); *G01R 11/16* (2013.01); *G01R 11/24* (2013.01); *G01R 21/133* (2013.01); *G08C 23/04* (2013.01); *H04Q 9/00* (2013.01); *H04Q 2209/60* (2013.01); *Y02B 90/247* (2013.01); *Y04S 20/50* (2013.01)

(58) Field of Classification Search
CPC ...... G01R 21/133; G01R 11/02; G01R 11/16; G01R 11/24; G01R 1/00; Y02B 90/247; Y04S 20/50; G08C 23/00
See application file for complete search history.

(56) References Cited

U.S. PATENT DOCUMENTS

| | | | |
|---|---|---|---|
| 4,034,292 A | | 7/1977 | McClelland, III |
| 4,327,362 A | | 4/1982 | Hoss |
| 4,489,384 A | * | 12/1984 | Hurley et al. ................ 702/61 |

(Continued)

FOREIGN PATENT DOCUMENTS

| | | |
|---|---|---|
| EP | 0561712 | 9/1993 |
| EP | 980002 A1 * | 2/2000 |

(Continued)

*Primary Examiner* — Brian Zimmerman
*Assistant Examiner* — Sara Samson
(74) *Attorney, Agent, or Firm* — Craige Thompson; Thompson Patent Law

(57) ABSTRACT

Apparatus and associated methods relate to a Metered-Commodity Consumption Meter (MCCM) utilizing a rotationally occluded optical beam to simultaneously measure flow/consumption and verify operational integrity. In accordance with an exemplary embodiment, an existing MCCM may be retrofit by sealably attaching a module containing an optical system which may generate one or more optical beams. Each optical beam may have a defined optical path originating from an optical source and terminating at an optical sensor within the module. In an exemplary embodiment, a Rotational Retrofit Member (RRM) may be attachable to a rotational metering gear responsive to a flow/consumption of the metered commodity. The RRM may have an occluding blade which may partially occlude the optical beams periodically when the RRM rotates. In various embodiments, the MCCM may be retrofit to make the measurement of the metered commodity impervious to external magnetic fields.

20 Claims, 11 Drawing Sheets

(51) Int. Cl.
*G08C 23/04* (2006.01)
*H04Q 9/00* (2006.01)

(56) References Cited

U.S. PATENT DOCUMENTS

| | | | | |
|---|---|---|---|---|
| 4,634,859 | A | * | 1/1987 | Martell .................. 250/231.11 |
| 5,014,213 | A | | 5/1991 | Edwards et al. |
| 5,053,766 | A | * | 10/1991 | Ruiz-del-Portal et al. .................. 340/870.02 |
| 5,089,771 | A | | 2/1992 | Tanguay et al. |
| 5,148,233 | A | * | 9/1992 | Imamura et al. ........... 356/243.1 |
| 5,252,824 | A | * | 10/1993 | Picanyol .................. 250/231.13 |
| 5,750,983 | A | * | 5/1998 | Swanson .................. 250/231.13 |
| 6,194,018 | B1 | * | 2/2001 | Krauss .......................... 426/515 |
| 6,232,885 | B1 | | 5/2001 | Ridenour et al. |
| 6,271,523 | B1 | | 8/2001 | Weaver et al. |
| 6,313,756 | B1 | | 11/2001 | Ossa |
| 6,617,978 | B2 | | 9/2003 | Ridenour et al. |
| 6,998,601 | B2 | | 2/2006 | Chin et al. |
| 7,042,368 | B2 | | 5/2006 | Patterson et al. |
| 7,265,843 | B2 | | 9/2007 | Demia et al. |
| 7,267,014 | B2 | | 9/2007 | Winter |
| 7,329,858 | B2 | | 2/2008 | Okada |
| 7,377,184 | B1 | | 5/2008 | Schlachter |
| 7,663,503 | B2 | | 2/2010 | Winter |
| 7,973,673 | B2 | * | 7/2011 | Payne et al. .............. 340/870.02 |
| 2009/0256719 | A1 | * | 10/2009 | Boissonneault et al. .. 340/870.02 |

FOREIGN PATENT DOCUMENTS

| | | |
|---|---|---|
| WO | WO-02/099360 A1 | 12/2002 |
| WO | WO-03/003029 A2 | 1/2003 |

\* cited by examiner

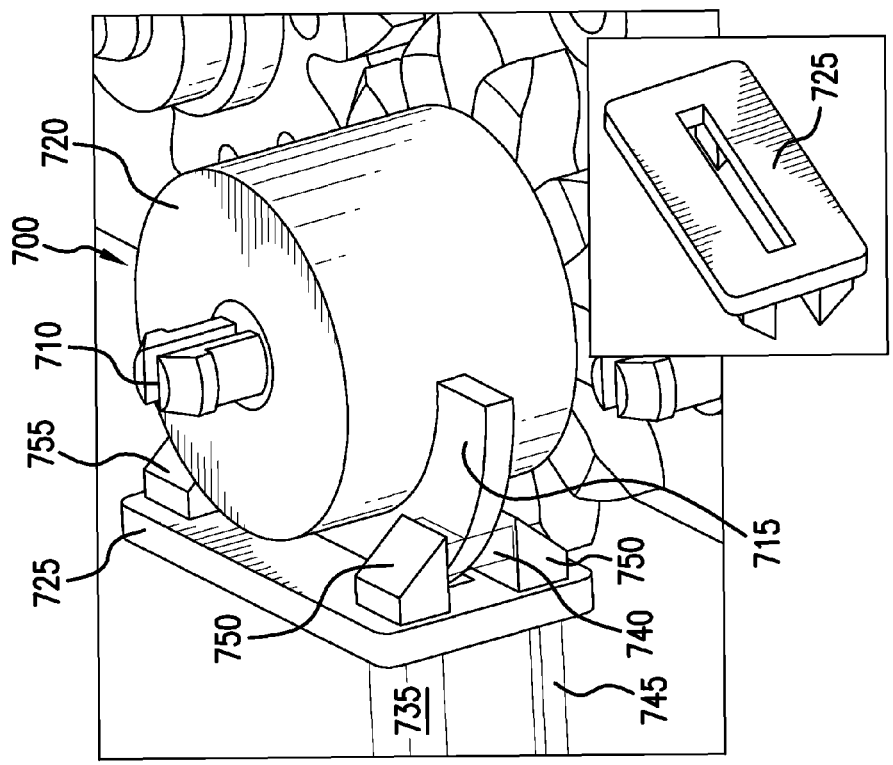
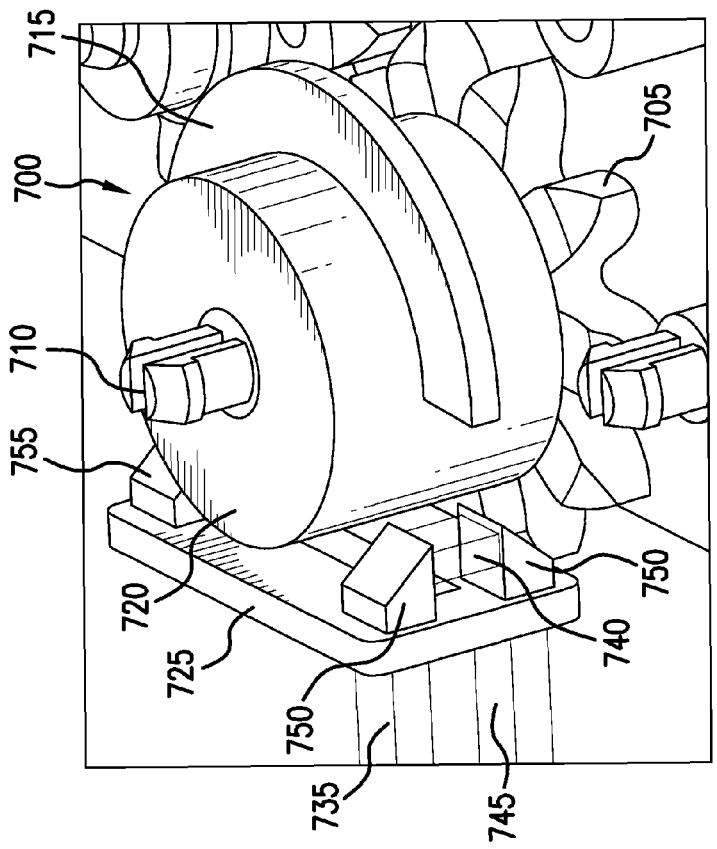
FIG. 7B
FIG. 7A ative mode may permit the life of the power source to be greatly extended by only bringing the RK out of sleep mode briefly and infrequently in accordance with meter precision specifications.

The details of various embodiments are set forth in the accompanying drawings and the description below. Other features and advantages will be apparent from the description and drawings, and from the claims.

MAGNETICALLY-IMPERVIOUS RETROFIT KIT FOR A METERED-COMMODITY CONSUMPTION METER

TECHNICAL FIELD

Various embodiments relate generally to commodity meters.

BACKGROUND

Utility meters are widely used in the measurement of many different types of commodities. For example, electrical meters are used for home residences as well as businesses and industries. Natural gas meters are used almost wherever natural gas is consumed. Water meters monitor the consumption of water, and many types of liquid flow meters are used to measure the consumption of such liquids.

While many people are honest and many businesses are run in a lawful fashion, some have attempted to disable the utility meters that measure the consumption of the commodities that they consume. Recently some have disabled meters that rely on a rotating magnetic pulse to cause a reed switch to open and close one time for each rotation of a rotating member. There even exist videos on the internet that describe how to disable such a meter.

SUMMARY

Apparatus and associated methods relate to a Metered-Commodity Consumption Meter (MCCM) utilizing a rotationally occluded optical beam to simultaneously measure flow/consumption and verify operational integrity. In accordance with an exemplary embodiment, an existing MCCM may be retrofit by sealably attaching a module containing an optical system which may generate one or more optical beams. Each optical beam may have a defined optical path originating from an optical source and terminating at an optical sensor within the module. In an exemplary embodiment, a Rotational Retrofit Member (RRM) may be attachable to a rotational metering gear responsive to a flow/consumption of the metered commodity. The RRM may have an occluding blade which may partially occlude the optical beams periodically when the RRM rotates. In various embodiments, the MCCM may be retrofit to make the measurement of the metered commodity impervious to external magnetic fields.

Various embodiments may achieve one or more advantages. For example, some embodiments may be impervious to external magnetic fields, preventing the disablement of a Metered-Commodity Consumption Meter (MCCM) by commodity thieves using external magnets. In some embodiments the use of optical sources and optical sensors within an enclosed housing may help prevent a thief from tampering with a MCCM. In an exemplary embodiment, a MCCM may be retrofittably upgraded to add magnetic disturbance rejection during operation to an existing MCCM. In some embodiments, an ability for a Retrofit Kit (RK) to provide up-down counting of consumption may permit the metered commodity to be both consumed and provided at different times of use. Some metered-commodity sites may generate electricity, for example, by using a windmill. And such sites may at times supply more electricity than the sites consume, such as, for example, during windy conditions. In some embodiments, by monitoring the strengths of both the non-occluded and partially occluded optical beams, an exemplary RK may be able to detect the quality of the power supply. If the strength of the partially occluded optical beam falls beneath a predetermined threshold, for example, the RK may determine that a battery replacement may be needed. In some embodiments, a dynamic sleep-

BRIEF DESCRIPTION OF THE DRAWINGS

FIGS. 7A-7B depicts a close-up perspective view of an exemplary rotational retrofit member in states of non-occlusion and partial occlusion of an optical beam.

Like reference symbols in the various drawings indicate like elements.

DETAILED DESCRIPTION OF ILLUSTRATIVE EMBODIMENTS

Figure 1:
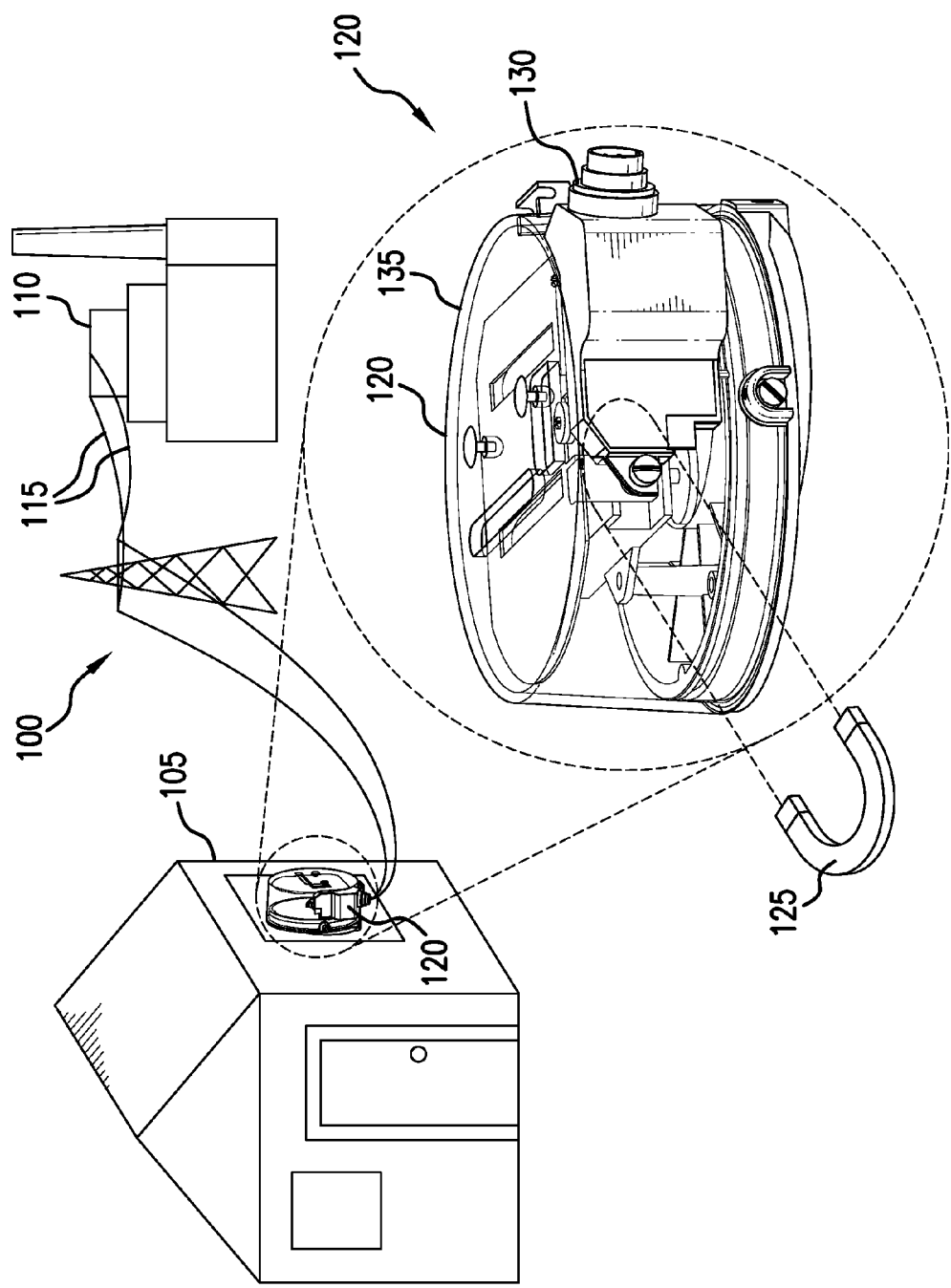
FIG. 1 depicts a field application of an exemplary Retrofit Kit (RK) used for the purpose of monitoring the consumption of electricity by a facility.

FIG. 1 depicts a field application of an exemplary Retrofit Kit (RK) used for the purpose of monitoring the consumption of electricity by a house. In this figure, an exemplary electrical utility connection 100 is shown. A house 105 is connected to an electrical plant 110 via electrical wires 115. An electrical consumption meter 120 measures the electricity use of the house 105. A magnet 125 has been put near the electrical consumption meter 120 for the purpose of defeating the consumption measurement. The electrical consumption meter 120 is shown to have an exemplary Retrofit Kit (RK) 130 which may operate without compromise even in the presence of a magnetic field. The RK 130 has been affixed to a housing 135 of the pre-existing electrical consumption meter 120.

Figure 2:
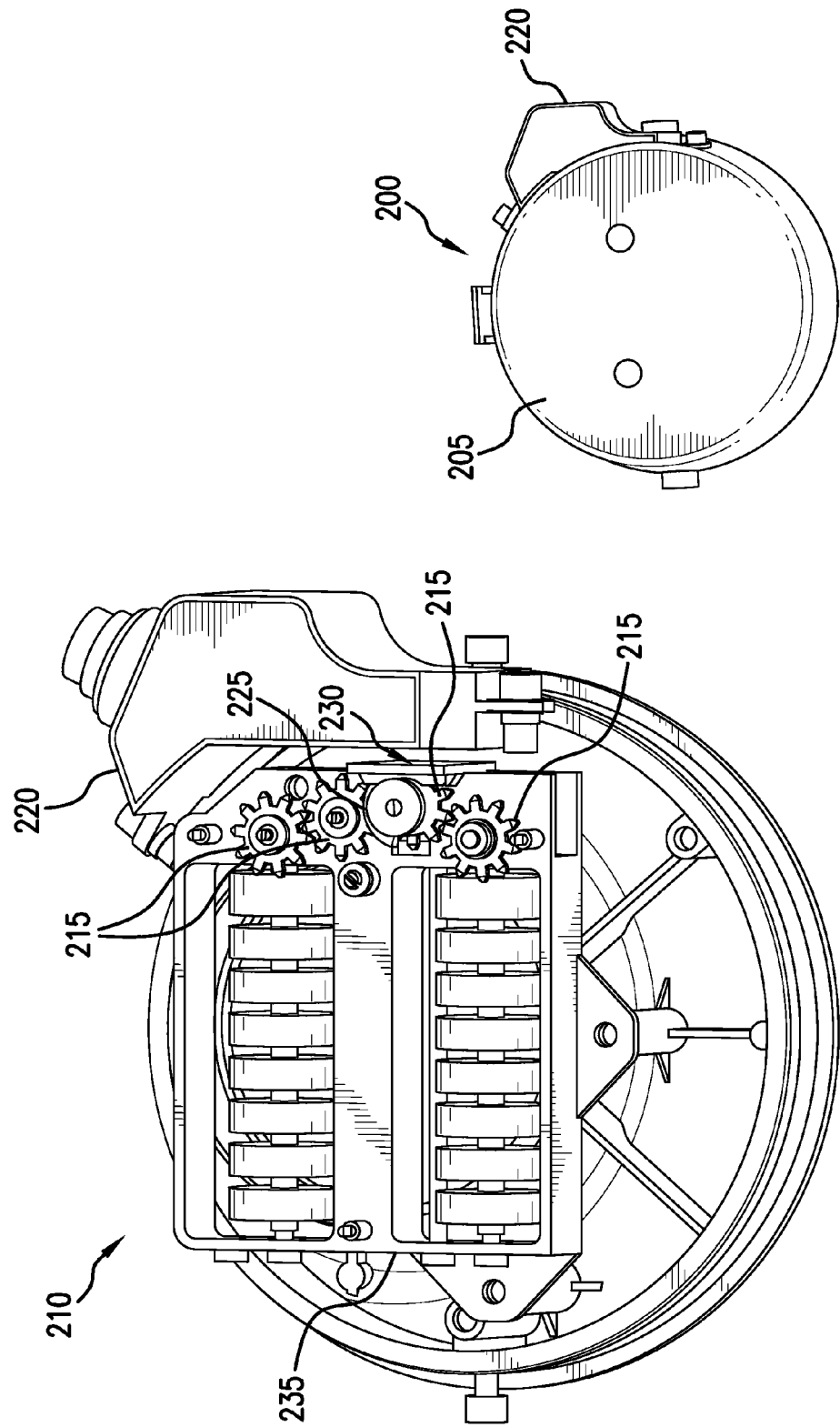
FIG. 2 depicts a schematic of an existing utility meter upgraded with an exemplary RK.

FIG. 2 depicts a schematic of an existing utility meter upgraded with an exemplary RK. In the FIG. 2 embodiment, an exemplary metered-commodity consumption meter is shown 200. The metered-commodity consumption meter 210 is also depicted with its housing 205 removed. Within the metered-commodity consumption meter 210 are gears 215. The gears 215 rotate in response to a flow or consumption of the metered commodity. An exemplary RK 220 is shown affixed to the metered-commodity consumption meter 200, 210. A rotational retrofit member 225 has been affixed to one of the gears 215. A prismatic element holder 230 is shown attached to a gear block 235. The prismatic element holder 230 is shown affixed adjacent to the rotational retrofit member 225.

Figure 3:
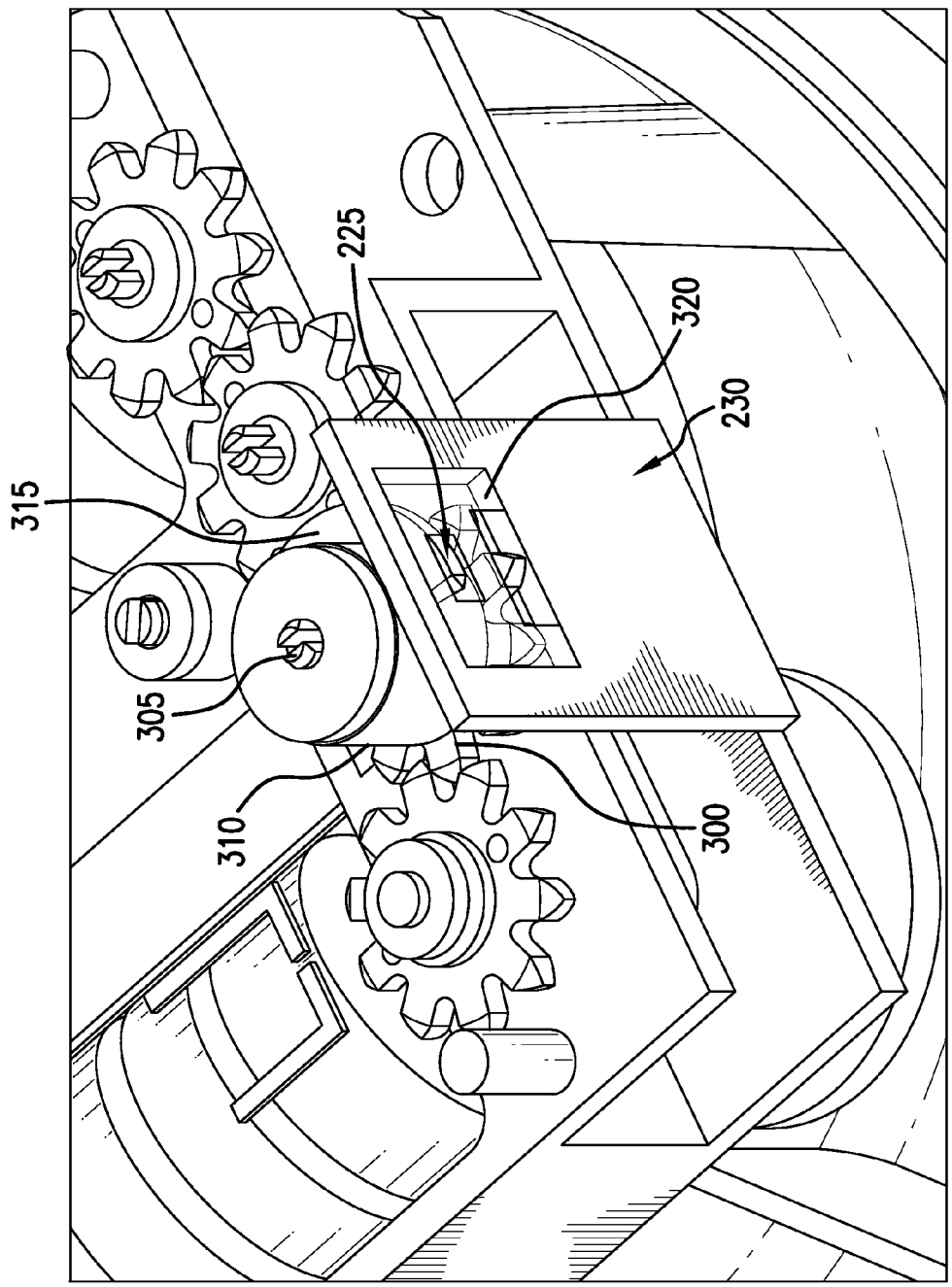
FIG. 3 depicts a close-up perspective view of an exemplary rotational retrofit member and exemplary prismatic element.

FIG. 3 depicts a close-up perspective view of an exemplary rotational retrofit member and exemplary prismatic element. In this exemplary embodiment, the prismatic element holder 230 is shown in perspective view relative to the rotational retrofit member 225. The rotational retrofit member 225 is shown coupled to a gear 300. The rotational retrofit member 225 shares a common axis of rotation with the gear 300 by sharing a common axel 305. The gear 300 rotates in response to the flow or consumption of the metered commodity. Each rotation of the gear 300 results in a corresponding rotation of the rotational retrofit member 225. In this exemplary embodiment, the rotational retrofit member has a cylindrical body 310 and an occluding blade 315. The prismatic element holder 230 holds a prismatic element 320, which may serve to guide one or more optical beams vertically past the rotational retrofit member 225, in this example.

Figure 4:
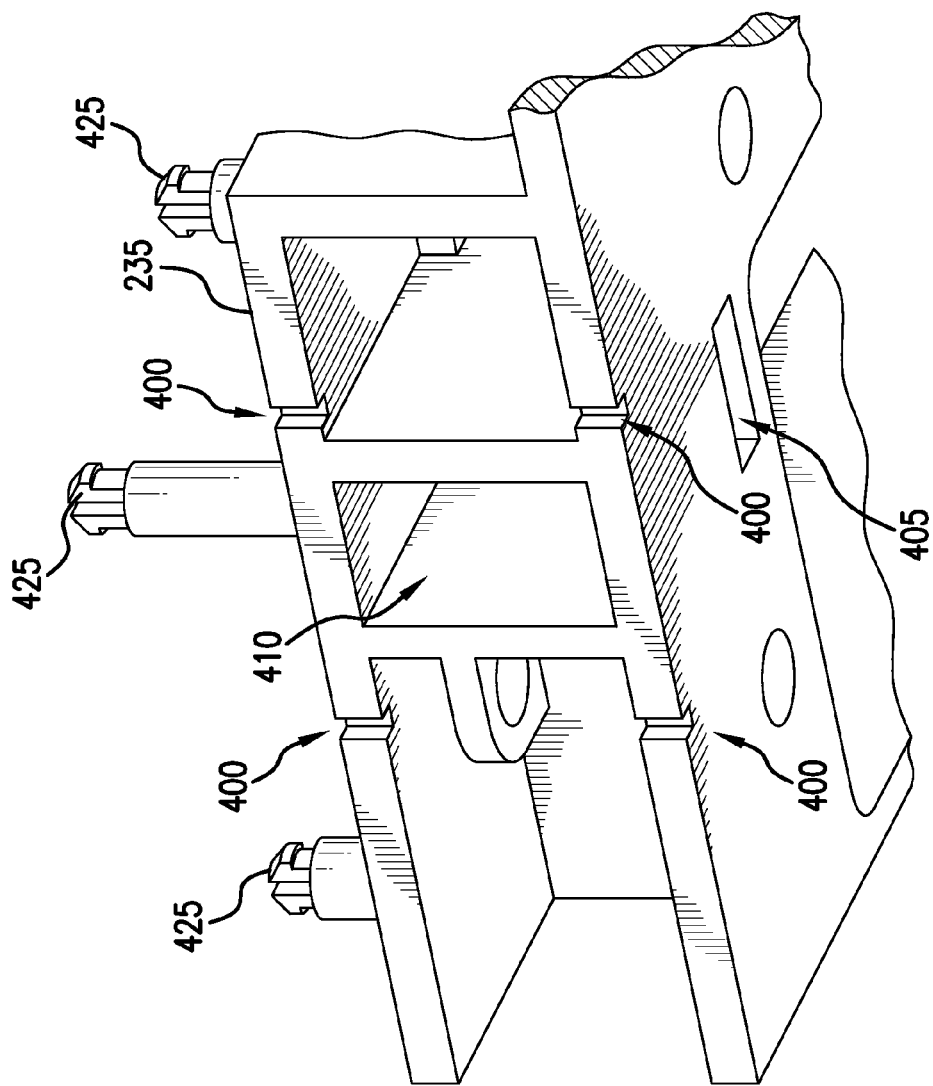
FIG. 4 depicts an exemplary prismatic element holder and an existing commodity gear block.
Figure 4:
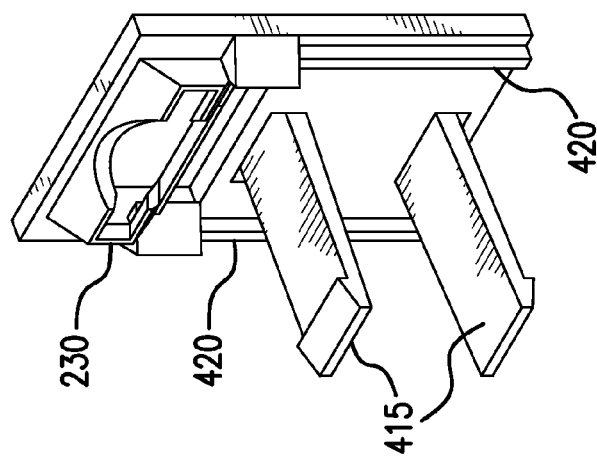

FIG. 4 depicts an exemplary prismatic element holder and an existing commodity gear block. In this exemplary depiction, a gear block 235 is shown stripped of all attached components. Also depicted is an exemplary prismatic element holder 230. In this example, the gear block 235 has vertical slots 400 and two aperture slots 405 (only one shown) to which the prismatic element holder 230 may attach. The prismatic element holder 230 has two tabs 415 and two vertical features 420. A channel 410 is shown, into which the tabs 415 of the prismatic element holder 230 may be inserted. When the tabs 415 of the prismatic element holder 230 are inserted fully into the channel 410, the two tabs 415 may snap into the corresponding aperture slots 405. The vertical features 420 may then align within the vertical slots 400 of the gear block 235. Three gear axles 425 are also shown. In this exemplary embodiment, the gear axles may be populated with gears.

Figure 5:
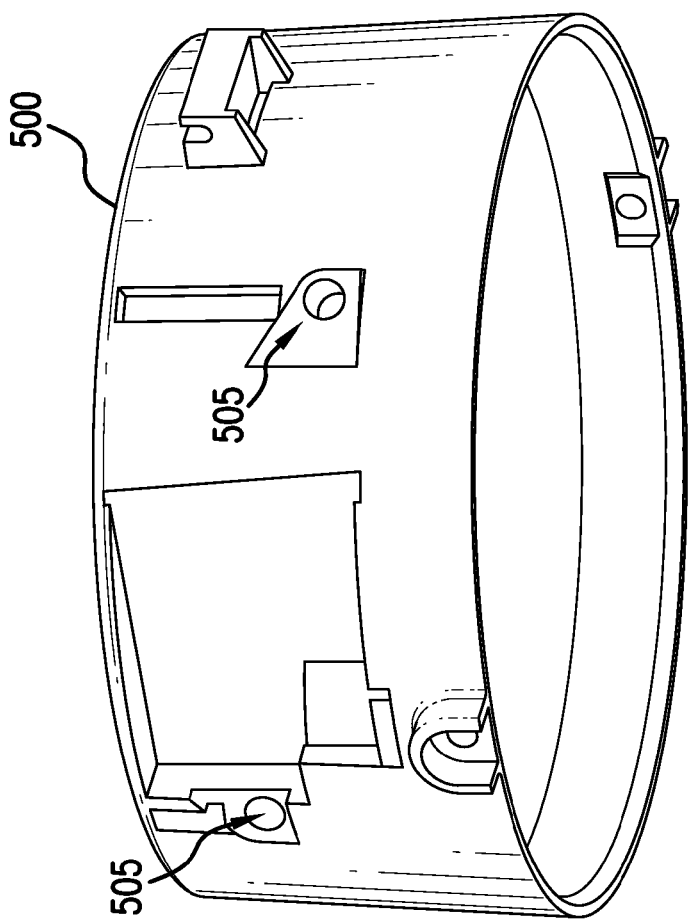
FIG. 5 depicts an existing commodity meter housing and the attachment points for an exemplary RK.
Figure 5:
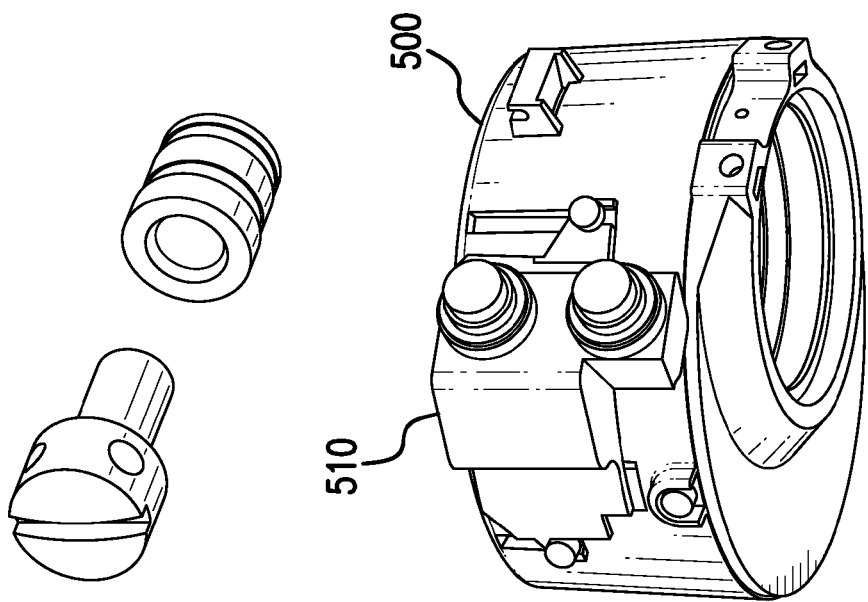

FIG. 5 depicts an existing commodity meter housing and the attachment points for an exemplary RK. In this exemplary figure, a metered-commodity housing 500 is shown. The metered commodity housing has two attachment holes 505, to which an exemplary housing 510 for an exemplary RK may be attached. This exemplary embodiment may be a gas flow meter, for example. In an exemplary embodiment, the RK may attach to an electrical utility meter. In some embodiments, the RK may attach to a natural gas utility meter. In various embodiments, the RK may attach to a liquid gas meter. In an exemplary embodiment, the RK may attach to a water meter, for example. In some embodiments a gasket may be used to seal the RK housing to the utility meter.

Figure 6:
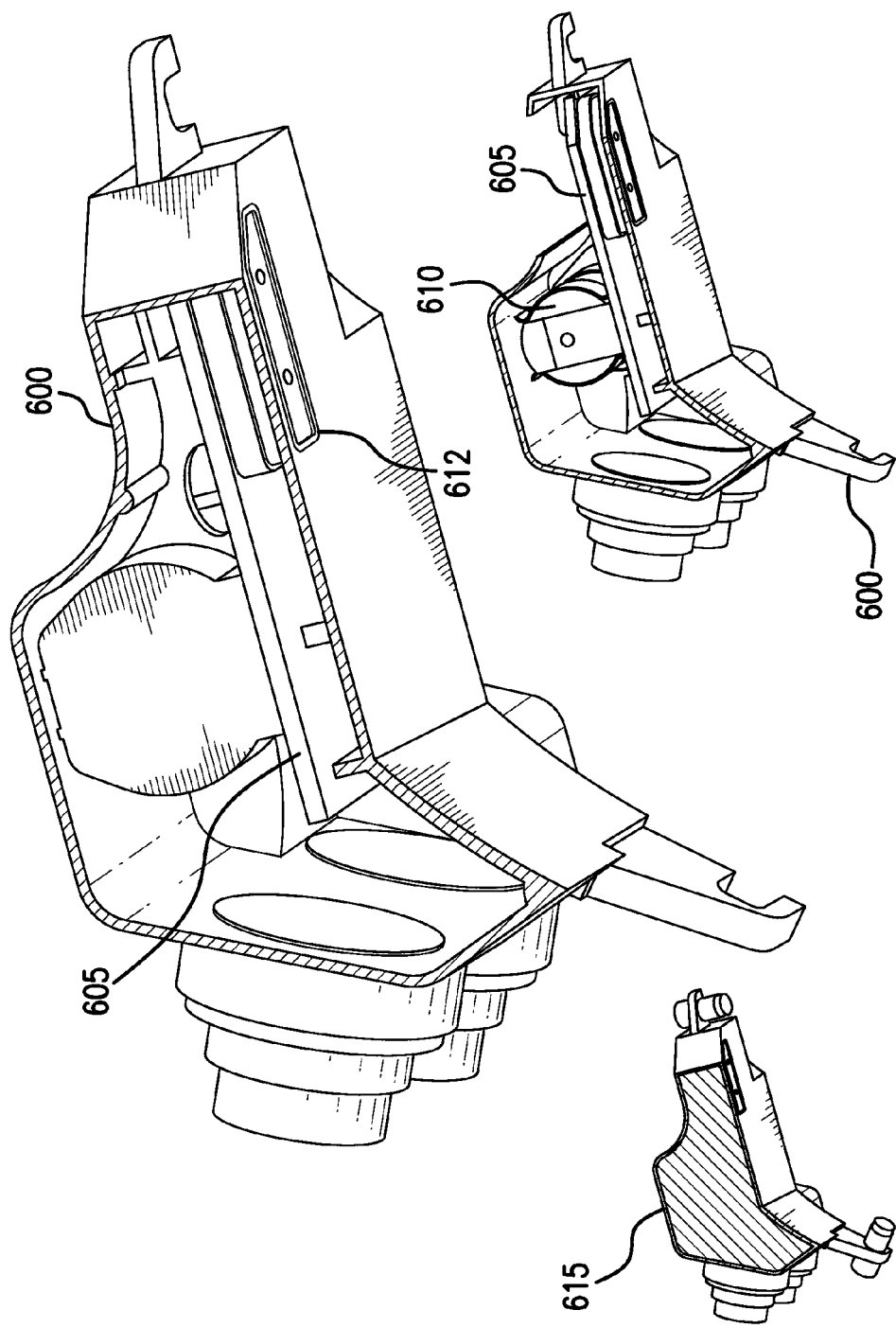
FIG. 6 depicts a perspective view of an exemplary RK showing battery and circuitry board.

FIG. 6 depicts a perspective view of an exemplary RK showing battery and circuitry board. In this figure, an RK housing 600 is shown. Inside the RK housing 600 is a printed circuit board (PCB) 605 and a battery 610. The PCB 605 in this exemplary embodiment may have one or more optical sources for generating the optical beams described above. The PCB 605 may also have one or more optical sensors for detecting the strength of the optical beam or beams. A microcontroller or processor may reside on the PCB 605. The processor may schedule measurements, and sleep modes, for example. In this example, a gasket 612 is shown to prevent water from seeping into the RK housing 600. In the embodiment pictured, the unit may have potting 615 to seal/protect the electronic components against water, vibration, etc. In some exemplary embodiments, a battery 610 may supply power to the RK. In various embodiments, power may be supplied in other ways. For example an electrical utility meter may supply power by the electricity it is metering.

FIGS. 7A-7B depicts a close-up perspective view of an exemplary rotational retrofit member in states of non-occlusion and partial occlusion of an optical beam. In the FIGS. 7A-7B embodiment, an exemplary rotational retrofit member 700 is shown affixed to a rotational gear 705 on the shared axle 710. The rotational gear 705 and the rotational retrofit member 700 both may rotate in unison about the shared axle 710 in response to a flow or consumption of the metered commodity. In this exemplary embodiment, the rotational retrofit member 700 has an occluding blade 715 projecting radially from a cylindrical body 720. The occluding blade 715 projects only from an arc portion of a circumference of the cylindrical body 720 in this example.

In the FIGS. 7A-7B embodiment, an exemplary prismatic element 725 is depicted. The prismatic element 725 is shown reflecting and/or refracting an optical beam 735, 740, 745. The optical beam 735, 740, 745 is shown with a horizontal entering optical beam 735 into the prismatic element 725. The entering optical beam 735 is then bent downward for a vertical portion of travel 740 adjacent to the cylindrical body 720. The optical beam 740 then is bent again to exit in a horizontal fashion 745. The exiting optical beam 745 is shown antiparallel with the entrance 735, in this example.

In FIG. 7A, the rotational retrofit member is rotated such that the occluding blade 715 is positioned away from the vertical portion of travel 740 of the optical beam 735, 740, 745. But in FIG. 7B, the rotational retrofit member 700 is rotated such that the occluding blade 715 is partially occluding the optical beam 740. In FIG. 7B, the entering beam 735 is shown to be full, indicating an optical beam 735 that has not been attenuated. But the exiting beam 745 is shown to be narrow, indicating an attenuation of the optical beam 735. In this embodiment, the optical beam 740 is not entirely blocked by the occluding blade 715. A fraction of the optical beam 740 passes by the outer edge of the occluding blade 715 and continues on its predetermined path.

A second optical beam may be used to assist in the determination of a net clockwise (or counterclockwise) count of rotations. In FIGS. 7A-7B, the prismatic element 725 has two sets of refraction/reflection features 750, 755. Each set of refraction/reflection features 750, 755 may be used to define an optical path. The first set of refraction/reflection features 750, in this example, defines the optical path for the optical beam 735, 740, 745. The second set of refraction/reflection features 755 may be used to define a second optical path for a second optical beam. Both beams may be partially occluded by the occluding blade 715. In this example, neither beam would be occluded in FIG. 7A, but both beams would be occluded in FIG. 7B. As the rotational retrofit member 700 rotates from its position in FIG. 7A to its position in FIG. 7B in a clockwise direction, the optical beam 740 will first experience partial occlusion. As the rotation continues in a clockwise direction, both beams would then be partially occluded as the rotational retrofit member gets to the position shown in FIG. 7B. With continued clockwise rotation, the first optical beam 740 will no longer experience occlusion as the occluding blade 715 rotates past its the refraction/reflection features 740. And then, the second optical beam will become unoccluded as the rotational retrofit member 700 once again reaches the position shown in FIG. 7A.

When an optical beam has been attenuated by the rotational retrofit member, in some embodiments, a small percentage of the source optical energy may continue past or through the occluding blade and may terminate at an optical sensor. The optical sensor's measurement of the intensity of the optical beam may signify whether or not the occluding blade is interposed in the path of the optical beam. In some embodiments, the time sequence of the measurement results taken from the optical sensors may be used to count the net rotations of the rotational retrofit member. For example, the time sequence of the measurement results may be as shown in the following table:

| Measurement time (sec) | First optical sensor measurement (V) | Second optical sensor measurement (V) |
|---|---|---|
| 0 | 2.4 | 2.4 |
| 2 | 0.7 | 2.4 |
| 4 | 0.7 | 0.7 |
| 6 | 0.7 | 0.7 |
| 8 | 2.4 | 0.7 |
| 10 | 2.4 | 2.4 |

In the above table, the first optical sensor measurement leads the second optical sensor measurement as the rotational retrofit member rotates in response to a positive consumption of the commodity being metered. As the measurement of the second sensor transitions from low to high, one unit of consumption may be added to the counter if the first sensor measurement is high during this transition, in this example. But as the measurement of the second sensor transitions from low to high, one unit of consumption may be subtracted from the counter if the first sensor measurement is low during the transition. In this example, the use of two optical sensors and two optical beams may perform a net up-down count of consumption.

Figure 8:
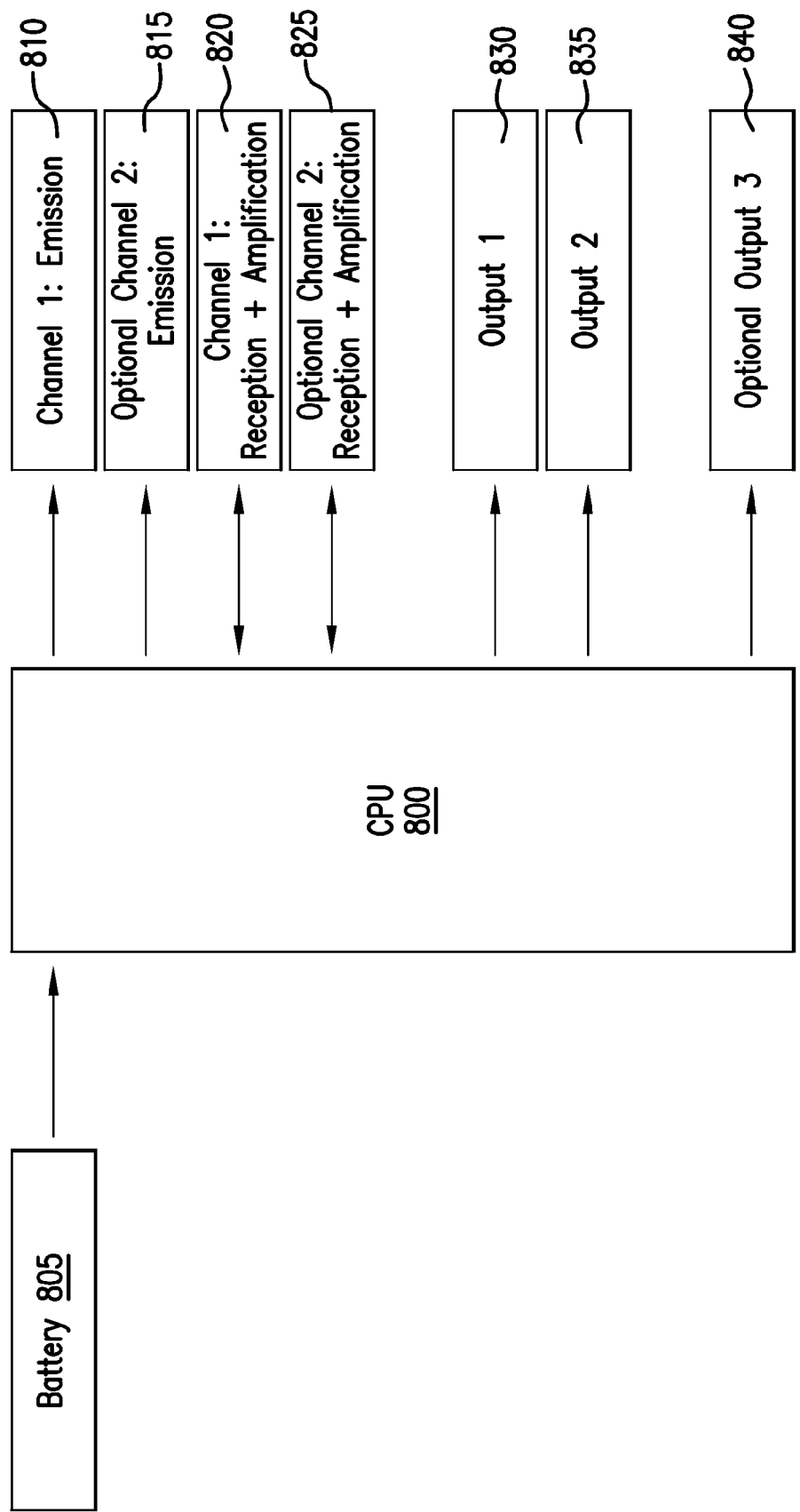
FIG. 8 depicts a schematic diagram of a of the system components of an exemplary RK.

FIG. 8 depicts a schematic diagram of a of the system components of an exemplary RK. In the FIG. 8 embodiment, a CPU 800 is shown being supplied power by a battery 805. The CPU 800 controls the optical emission of one or two optical sources 810, 815. In some embodiments, the optical source or sources may be LEDs. In some embodiments the optical source or sources may be incandescent lamps. In some embodiments, one optical source may be used in conjunction with a beam splitter to generate two optical beams. The CPU 800 is shown in communication with one or two optical sensors 820, 825. The CPU is also shown in communication with two or three outputs 830, 835, 840. One output may be used to store the net commodity consumption in non-volatile memory, for example. In some embodiments, one of the outputs may provide for communication with a utility company. In some embodiments, an LCD display may be one of the outputs, for example.

Figure 9A:
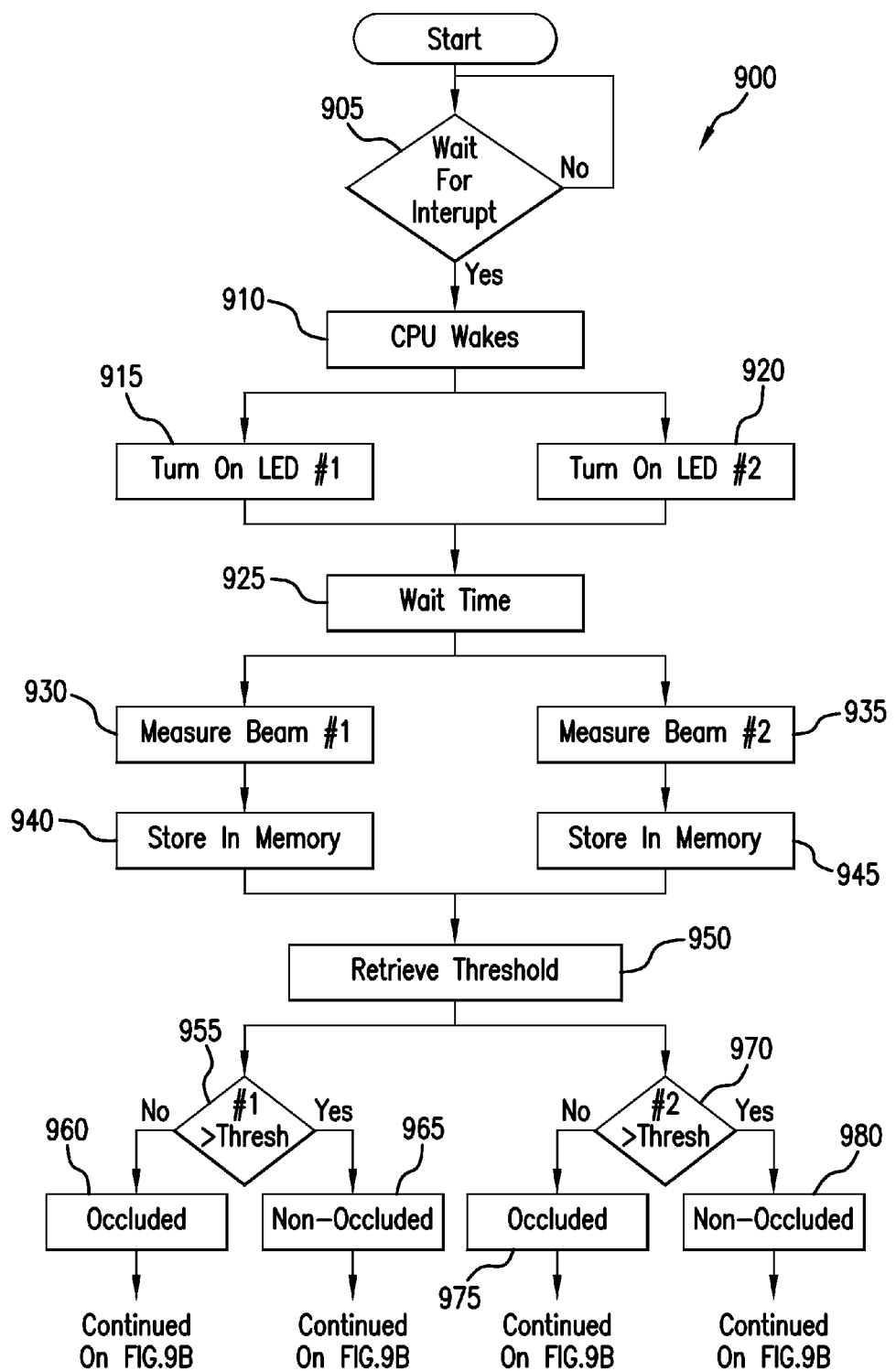
FIGS. 9A-9B depict a flow chart of the processor operations of an exemplary RK.
Figure 9B:
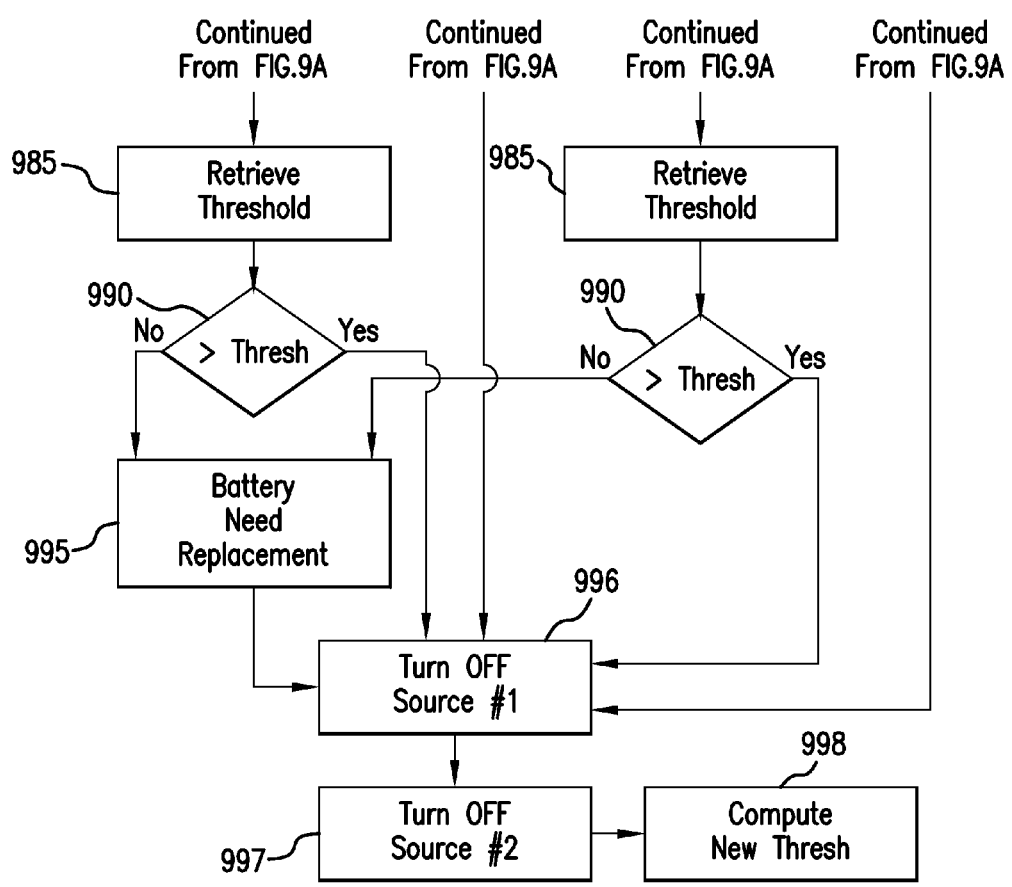

FIGS. 9A-9B depict a flow chart 900 of the processor operations of an exemplary RK. In the FIGS. 9A-9B flowchart 900, the operations of a CPU are described. The CPU waits for an interrupt signal 905. If the CPU receives and interrupt signal the CPU wakes 910. But if no interrupt signal is received by the CPU it continues to wait for an interrupt signal 905. After waking, the CPU sends a turn-on command to a first LED 915. The CPU also sends a turn-on command to a second LED 920. The CPU then waits a predetermined time for the LEDs to reach full brightness 925. The CPU then sends a command to the first optical detector to transmit its measurement of optical intensity 930. The CPU sends a command to the second optical detector to transmit its measurement of optical intensity 935. The CPU then stores each of the measurements in a memory location 940, 945. The CPU then retrieves an optical threshold value from memory 950. The CPU then compares the first measurement to the optical threshold value 955. If the first measurement is greater than the optical threshold, then the CPU determines non-occlusion of the first optical beam 960. If, however, the first measurement is not greater than the optical threshold, then the CPU determines partial occlusion of the first optical beam 965. The CPU also compares the second measurement to the optical threshold value 970. If the second measurement is greater than the optical threshold, then the CPU determines non-occlusion of the second optical beam 975. If, however, the second measurement is not greater than the optical threshold, then the CPU determines partial occlusion of the second optical beam 980.

The CPU then retrieves a power threshold from memory 985. If partial occlusion was determined for the first optical beam, then the CPU compares the first optical measurement with the power threshold 990. If the first measurement is less than the power threshold, the CPU determines that the battery needs replacement 995. If, however, the first optical measurement is greater than the power threshold, then the CPU takes no action. If partial occlusion was determined for the second optical beam, then the CPU compares the second optical measurement with the power threshold. If the second measurement is less than the power threshold, the CPU determines that the battery needs replacement 995. If, however, the second optical measurement is greater than the power threshold, then the CPU takes no action.

After all the threshold comparisons have been made, the CPU then turns off the first optical source 996. The CPU turns off the second optical source 997. The CPU then computes a new optical threshold 998. The CPU then computes a new wake interval 999. The CPU sends the wake interval to the wake interrupter. The CPU then sleeps.

Figure 10:
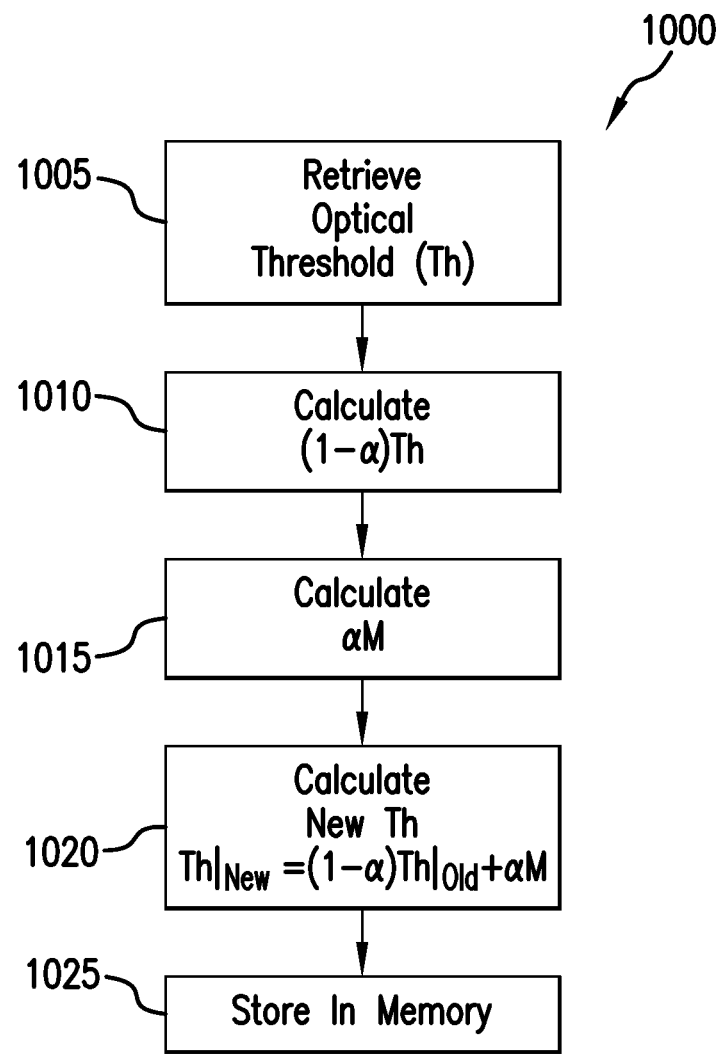
FIG. 10 depicts a method of computation of the optical threshold.

FIG. 10 depicts a method of computation 1000 of the optical threshold. In the FIG. 10 embodiment, the CPU retrieves the past optical threshold 1005. The CPU then multiplies this past optical threshold by a positive number less than one, in this case (1−alpha), alpha being a small positive number much less than one 1010. The CPU then multiplies the current channel's measurement by alpha 1015. The CPU then adds (1−alpha) times the past threshold to the product of alpha and the current measurement 1020. The CPU then stores the new optical threshold in memory 1025. In this example, an alpha filter may be used to generate a running average of non-occluded and partially occluded optical intensity measurements.

Although various embodiments have been described with reference to the Figures, other embodiments are possible. For example, in some embodiments, only one optical beam will be used. Such an embodiment may be used, for example, in situations where unidirectional flow of the metered commodity is expected. In some embodiments, the wake interval may be determined based on the recent rotational speed of use. For example, in some embodiments, if the commodity being metered is currently being consumed at a very low rate, then the wake interval may be increased. In some examples, when the rate of current consumption of the metered commodity is high, the wake interval may be shortened. The shortened or lengthened sleep duration may be calculated so as to preserve the precision of the measurement of commodity consumption. For example, while the commodity consumption is low, good measurement precision will result even when long time intervals between successive measurements are used. But while the commodity consumption is high, more frequent measurement must be made, which in turn may require shorter sleep durations.

In accordance with an exemplary embodiment, the rotational retrofit member may share an axis or rotation with the rotational metering gear to which it may be attached. In some embodiments, two optical beams may be generated within the housing. Each of the two optical beams may have a path that passes by the rotational retrofit member at a predetermined angular location relative to its axis of rotation. In some embodiments, the rotational retrofit member may have an occluding blade radially projecting away from the axis of rotation from an arc portion of a circumference of the member. The occluding blade may attenuate the intensity of one or both of the optical beams, in this example, when the rotational retrofit member is rotated so as to position the occluding blade into one or both of the optical beam paths.

In various embodiments, apparatus and methods may involve a very small wake/sleep duty cycle. For example, in an exemplary embodiment, the wake time may be as short as a few milliseconds, and the sleep time may range from 2 seconds to 60 seconds, depending on the current consumption rate. In such embodiments, the battery lifetime may be increased to as long as fifteen years of more, for example. In some embodiments, the wake time may be longer than a few milliseconds, but the LED may be only powered for a few milliseconds.

In various embodiments a utility meter may be retrofitted with a diskless least-significant-digit wheel using an optical photo-interrupter to achieve magnetic impervious metering. In some embodiments, the diskless least-significant-digit wheel may be in the form of a radial occluding blade. In some embodiments, the diskless wheel may be a semi-opaque blade. In some embodiments, a semi-opaque blade may entirely intercept an optical beam. The partial occlusion of such a device may occur because of the semi-transparency of a semi-opaque blade may permit a fraction of the beam to transmit through the blade, for example.

In some embodiments, RK may have a housing containing an apparatus configured to perform diskless least-significant-digit wheel using an optical photo-interrupter to achieve magnetic impervious metering, which housing is retrofittable to an existing meter. In some embodiments the housing of the RK may be attached by screws. In some embodiments the housing may be attached by bolts, for example. In some embodiments, the housing may attach onto the existing utility meter using already existing means.

In accordance with an exemplary embodiment, an intermittent verification of operational state may be monitored by measuring the intensity of a partially occluded optical signal, which optical signal contains real-time information about measure of a metered commodity. In some embodiments the measure of the partially occluded optical signal may provide a measure of the health of the power supply of the RK. In some embodiments the measure of the partially occluded optical signal may provide a measure of the health of the occluding disk, for example.

In various embodiments, a modulated sleep mode interval may be based upon a measurement of a metered commodity to maintain a precision of the measurement within a predetermined range. In some embodiments such a determination of the sleep mode interval may permit the prolonging of battery life. In some embodiments, the interval calculation may be performed by a processor or the RK. In some embodiments, a separate interval calculator may perform the sleep mode interval calculations.

In accordance with another embodiment, an occlusion blade may have discrete regions, in which different levels of partial occlusion my result. In some embodiments, the duty cycle of the arc portion of the circumference may be substantially about fifty percent. In some embodiments the angular separation of the two optical beams may be substantially about 90 degrees with respect to the axis of a rotational retrofit member. In such an embodiment the duty cycle of each of the four states of occlusion may be approximately 25% (see table below).

| State of First Optical Beam | State of Second Optical Beam | Duty Cycle (Percent of time in state) |
| --- | --- | --- |
| Partial occlusion | Partial occlusion | 25% |
| Partial occlusion | No occlusion | 25% |
| No occlusion | Partial occlusion | 25% |
| No occlusion | No occlusion | 25% |

In the table immediately above, as a rotational retrofit member having an occluding blade extending from 180 degrees of arc, each beam will be partially occluded 50% of the time. In the embodiment in which the beams may be located 90 degrees from one another with respect to the axis of rotation of the rotational retrofit kit, the first beam may transition exactly 90 degrees before (or after) the second optical beam transitions. There may exist a predetermined angular range where partial occlusion occurs for an optical beam. Each optical beam may have a unique predetermined angular range of the rotational retrofit member in which partial occlusion may occur. The intersection of the predetermined angular ranges of both optical beams may provide simultaneous partial occlusion for both optical beams. The intersection of the complements, those angles not in the predetermined angular ranges, of both ranges may provide simultaneously unoccluded optical beams, for example. Such an embodiment may permit the minimum duty cycle for wake/sleep modes. Some embodiments have other angular positions. For example, in one embodiment the angular positions of two optical beams may be greater than or less than 90 degrees for example.

In various embodiments, an exemplary RK may measure a flow/consumption of a metered-commodity. For example, some embodiments may include retrofit enclosure housing configured to mechanically couple to an existing commodity meter. Some examples may include an optical source within the housing. The optical source may generate an optical beam having an optical path, for example. One exemplary embodiment may include an optical sensor within the housing. The optical sensor may measure an intensity of the optical beam, for example. Some embodiments may include a rotational retrofit member being attachable to a rotational metering gear responsive to the flow/consumption of the metered-commodity. The rotational retrofit member and the rotational metering gear may share an axis of rotation. The rotational retrofit member may have an occlusion blade extended radially out from an arc portion of the rotational retrofit member about the axis of rotation. For example, in some embodiments, the rotational retrofit member may have a cylindrical body portion and an occluding blade portion. The occluding blade may project radially out from the cylindrical walls of the cylindrical body portion, for example. The occluding blade may project radially out over an arc subset of the circumference of the cylindrical body. For example, in some embodiments, the arc portion may include a 180 degree contiguous subset of a 360 degree circumference. In such an embodiment the occluding blade may be absent from the complement portion, that portion not included in the arc portion, of the circumference.

In various exemplary embodiments, the optical path may pass adjacent to the rotational retrofit member at an angular position relative to the axis of rotation. In some embodiments, the optical beam may pass parallel to the axis of the rotational retrofit member, for example. Is some embodiments, the intensity of the optical beam may be attenuated by the occlusion blade when the rotational retrofit member has an angular orientation within a predetermined angular range. For example, when the occlusion blade is rotated into the path of the optical beam, the optical beam may be attenuated. In some embodiments the range of attenuation may be between 50% and 90%. In various embodiments the range of attenuation may be between 70% and 95%. In some embodiments, the range of attenuation may be between 30% and 70%, for example.

In one exemplary embodiment the RK may include a processor. The process may receive a signal representation of the intensity of the optical beam as detected by the optical sensor, for example. In some embodiments, the processor may send a command to control the energizing and de-energizing of an optical source. In some embodiments, the processor may calculate the rotational speed of the rotational retrofit member based upon the signals representations of the intensity received. In various embodiments, the processor may use the rotational speed of the rotational retrofit member to calculate a sleep interval. The sleep interval may be calculated to maintain a precision of the metered-commodity flow/consumption within a predetermined range.

In some embodiments, partially attenuating the optical beam during a predetermined angular range of rotation may be performed by an occluding blade attached to a rotational metering gear. In such an embodiment, as the rotational metering gear rotates, the occluding blade may be interposed into the optical beam during a portion of the rotation. In various embodiments, attaching a RK system to an existing commodity meter may be performed using bolts. In some embodiments, such an attachment may involve a gasket to seal the RK system to an already existing commodity meter. In some embodiments, a wake-up interval signal may be generated based upon the rotation speed; the wake-up interval may be calculated to maintain a precision of the metered-commodity flow/consumption within a predetermined range. In such an embodiment, the wake-up interval may be calculated to permit multiple optical measurements during a single rotation. For example the processor may calculate the rotation time to be every 2 seconds. The processor may calculate the wake-up interval needed for the system to be four times every rotation or in this example every half second. In an exemplary two optical beam embodiment, the processor may use a criterion of four measurements per rotation, for example. In an exemplary single optical beam embodiment, the processor may use a requirement of two measurements per rotation, for example.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated.

What is claimed is:

1. A metered-commodity measurement device to measure a consumption of a metered-commodity, the device comprising:
   a retrofit enclosure housing configured to mechanically couple to an existing commodity meter;
   one or more optical sources within the retrofit enclosure housing, the one or more optical sources to generate a first optical beam having a first optical path, and a second optical beam having a second optical path;
   a first optical sensor within the retrofit enclosure housing, the first optical sensor to receive the first optical beam and output a first intensity signal indicative of a measure of an intensity of the first optical beam;
   a second optical sensor within the retrofit enclosure housing, the second optical sensor to receive the second optical beam and output a second intensity signal indicative of a measure of an intensity of the second optical beam;
   a rotational retrofit member mechanically coupled to a rotational metering gear of the existing commodity meter, the rotational metering gear is responsive to a consumption of a metered-commodity, the rotational retrofit member and the rotational metering gear having a shared axis of rotation, the rotational retrofit member having an occlusion blade extended radially out from an arc portion of the rotational retrofit member about the axis of rotation; and
   a controller that receives the first intensity signal and the second intensity signal, the controller generates a battery-health status signal based upon the received first intensity signal and second intensity signal;
   wherein the first optical path passes adjacent to the rotational retrofit member at a first angular position relative to the axis of rotation;
   wherein the second optical path passes adjacent to the rotational retrofit member at a second angular position relative to the axis of rotation;
   wherein the first optical beam is attenuated by the occlusion blade when the rotational retrofit member has an angular orientation within a first predetermined angular range; and
   wherein the second optical beam is attenuated by the occlusion blade when the rotational retrofit member has an angular orientation within a second predetermined angular range.

2. The device of claim 1, wherein the attenuation of the first optical beam is between 50% and 90% when the rotational retrofit member has an angular orientation within the first predetermined angular range.

3. The device of claim 1, wherein the attenuation of the first optical beam is between 70% and 95% when the rotational retrofit member has an angular orientation within the first predetermined angular range.

4. The device of claim 1, wherein the arc portion of the rotational retrofit member is between 90 degrees and 270 degrees.

5. The device of claim 1, wherein the arc portion of the rotational retrofit member is between 135 degrees and 225 degrees.

6. The device of claim 1, wherein both the first optical beam and the second optical beam are simultaneously attenuated by the occlusion blade when the rotational retrofit member has an angular orientation within a third predetermined angular range substantially approximately that of the intersection of the first predetermined angular range and the second predetermined angular range.

7. The device of claim 1, wherein the first optical beam and the second optical beam are simultaneously unoccluded by the occlusion blade when the rotational retrofit member has an angular orientation within a fourth predetermined angular range substantially approximately that of the intersection of the complement of the first predetermined angular range and complement of the second predetermined angular range.

8. The device of claim 1, wherein the controller generates a signal representing the net clockwise or counterclockwise count of the rotational retrofit member, based on the received first intensity signals and second intensity signals.

9. The device of claim 1, further comprising a wake mode and a sleep mode, in the wake mode, the one or more optical sources are energized, and in the sleep mode, the one or more optical sources are de-energized.

10. The device of claim 9, wherein the controller calculates a rotational speed of the rotational retrofit member based upon the received first intensity signals and second intensity signals, the controller generates a wake-up interval signal based upon the rotation speed, the wake-up interval is calculated to maintain a precision of the metered-commodity consumption within a predetermined range.

11. A metered-commodity measurement system to measure a flow of a metered-commodity, the system comprising:
   a retrofit enclosure housing configured to mechanically couple to an existing commodity meter;
   an optical source within the retrofit enclosure housing, the optical source to generate an optical beam having an optical path;
   an optical sensor within the retrofit enclosure housing, the optical sensor to receive the optical beam and output an intensity signal indicative of a measure of an intensity of the optical beam;
   a rotational retrofit member mechanically coupled to a rotational metering gear of the existing commodity meter that, the rotational metering gear is responsive to a flow of a metered-commodity, the rotational retrofit member and the rotational metering gear having a shared axis of rotation, the rotational retrofit member having an partial-occlusion blade; and
   a processor that receives the intensity signal and generates a system-status signal based upon the received intensity signal;
   wherein the optical path passes adjacent to the rotational retrofit member; and
   wherein the intensity of the optical beam is attenuated by the partial-occlusion blade when the rotational retrofit member has an angular orientation within a predetermined angular range.

12. The system of claim 11, wherein the attenuation of the optical beam is between 50% and 90% when the rotational retrofit member has an angular orientation within the predetermined angular range.

13. The system of claim 11, wherein the processor generates a signal representing the rotational count of the rotational retrofit member, based on the received intensity signals.

14. The system of claim 11, further comprising a wake mode and a sleep mode, wherein during the wake mode the optical source is energized, and during the sleep mode the optical source is de-energized.

15. The system of claim 14, wherein the processor calculates a rotational speed of the rotational retrofit member based upon the received intensity signals, the controller generates a wake-up interval signal based upon the rotation speed, the wake-up interval calculated to maintain a precision of the metered-commodity flow within a predetermined range.

16. A metered-commodity measurement system to measure a flow of a metered-commodity, the system comprising:
   an optical source to generate an optical beam having an optical path;
   an optical sensor to receive the optical beam and output an intensity signal indicative of a measure of an intensity of the optical beam;
   a rotational retrofit member mechanically coupled to a rotational metering gear of an existing commodity meter, the rotational metering gear is responsive to a flow of a metered-commodity, the rotational retrofit member and the rotational metering gear having a shared axis of rotation, the rotational retrofit member having an occlusion blade extended radially out from an arc portion of the rotational retrofit member about the axis of rotation;
   a processor that receives the intensity signal and generates a system-status signal based upon the received intensity signal; and
   wherein the optical beam is attenuated by the occlusion blade when the rotational retrofit member has an angular orientation within a predetermined angular range.

17. The system of claim 16, further comprising means for attaching the system to an existing commodity meter.

18. The system of claim 16, wherein the processor generates a signal representing the rotational count of the rotational metering gear, based on the received intensity signals.

19. The system of claim 16, further comprising a wake mode and a sleep mode, wherein during the wake mode the optical source is energized, and during the sleep mode the optical source is de-energized.

20. The system of claim 19, further comprising means for generating a wake-up interval signal based upon a calculated rotation speed of the rotational metering gear, the wake-up interval calculated to maintain a precision of the metered-commodity flow within a predetermined range.

* * * * *